United States Patent
Shimonishi et al.

(10) Patent No.: US 6,303,466 B1
(45) Date of Patent: Oct. 16, 2001

(54) METHOD OF MANUFACTURING A SEMICONDUCTOR DEVICE

(75) Inventors: Satoshi Shimonishi, Kawasaki; Takanori Matsumoto, Yokkaichi, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/531,491

(22) Filed: Mar. 20, 2000

(30) Foreign Application Priority Data

Mar. 19, 1999 (JP) .................................................. 11-076834

(51) Int. Cl.⁷ .................................................. H01L 21/76
(52) U.S. Cl. .......................... 438/424; 438/758; 438/778; 438/710; 438/401; 438/246; 438/692
(58) Field of Search .................................... 438/246, 424, 438/710, 401, 692, 758, 778

(56) References Cited

U.S. PATENT DOCUMENTS

| 5,362,668 | * | 11/1994 | Tasaka | 437/67 |
|---|---|---|---|---|
| 5,425,845 | | 6/1995 | Wong . | |
| 5,554,565 | * | 9/1996 | Liaw et al. | 437/192 |
| 5,926,722 | * | 7/1999 | Jang et al. | 438/424 |
| 6,037,236 | * | 3/2000 | Jang | 438/401 |
| 6,074,931 | * | 6/2000 | Chang et al. | 438/424 |
| 6,074,954 | * | 6/2000 | Lill et al. | 438/710 |
| 6,124,206 | * | 9/2000 | Flietner et al. | 438/692 |

FOREIGN PATENT DOCUMENTS 7-307325   11/1995   (JP) .

* cited by examiner

Primary Examiner—Matthew Smith
Assistant Examiner—Victor V. Yevsikov
(74) Attorney, Agent, or Firm—Oblon, Spivak, McClelland, Maier & Neustadt, P.C.

(57) ABSTRACT

A method for manufacturing a semiconductor device capable of improving properties during etching without degrading original properties of a doped oxide film as a hard mask includes a step of baking the doped oxide film after patterned but prior to etching. Thereby, changes in configuration or shape upon etching caused by absorption of moisture is prevented.

20 Claims, 10 Drawing Sheets

SHAPE BEFORE ETCHING

FIG. 4A

SHAPE AFTER ETCHING

EFFECT OF BAKING — STI TAPER ANGLE

METHOD OF MANUFACTURING A SEMICONDUCTOR DEVICE

BACKGROUND OF THE INVENTION

This invention relates to a method for manufacturing a semiconductor device especially directed to formation of a trench.

To maximize the capacity obtained from a limited area of a semiconductor memory device, for example, a trench capacitor is used, and it is necessary to make a deep trench.

Such a deep trench is usually made by an etching process. As the hard mask for this etching, a CVD $SiO_2$ film obtained by decomposing TEOS (tetraethoxysilane, $Si(OC_2H_5)_4$) by low-pressure CVD (LP-CVD) has often been used conventionally.

However, this film involves a problem that it is difficult to remove it evenly when it is etched-off by dry etching or other method after a trench is made. This invites the problem that a difference in level is formed on a silicon oxide film after the dry etching for removing the CVD $SiO_2$ film has been performed and this level difference adversely affects subsequent steps of the manufacturing process. Moreover, in case of TEOS, there is another problem that the CVD $SiO_2$ film cannot be etched off soon after etching for forming trench.

On the other hand, there are doped oxides like BSG, BPSG, PSG as materials that have been treated similarly to insulating materials of the group of CVD-$SiO_2$ referred to above. These BSG, BPSG and PSG exhibit a higher etching speed during wet etching as compared with a TEOS film, for example, and they are advantageous because they can be readily removed after being used as a hard mask.

FIGS. 1A through 1D show cross-sectional views in different steps in a process of making a trench by using BSG as the doped oxide.

Figure 1A:
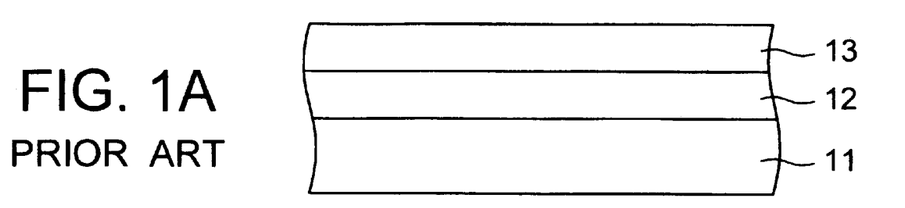
FIGS. 1A through 1D are cross-sectional views showing process steps in a conventional process for forming a trench by using a BSG film as a hard mask.

First formed on a silicon semiconductor substrate 11 is a BSG film by CVD, for example. Further coated on the BSG film is a resist 13 by spin coating, for example (FIG. 1A).

Figure 1B:
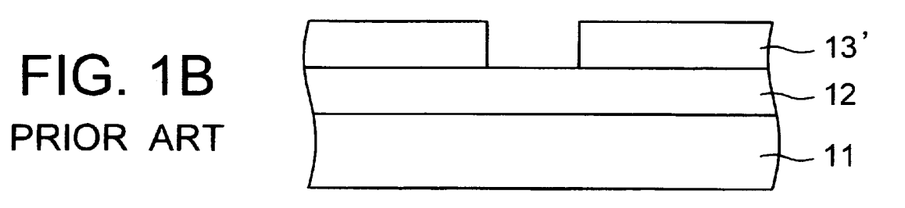

After that, exposure and development are conducted by using an exposure mask corresponding to a desired pattern, and the resist 13 is patterned (FIG. 1B).

Figure 1C:
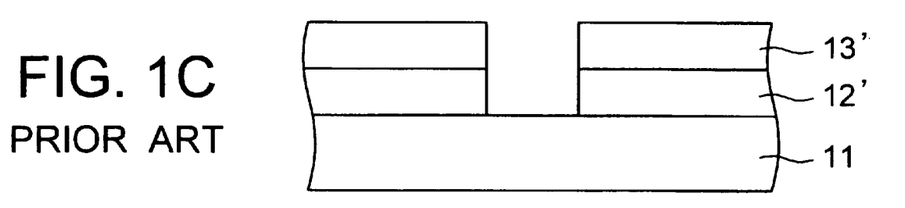

Then, by using the patterned resist 13' as an etching mask, the BSG film 12 is etched (FIG. 1C).

Figure 1D:
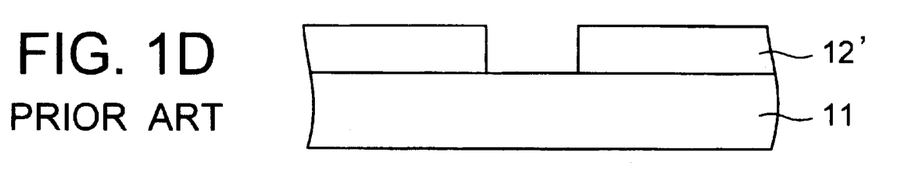

Subsequently, the resist 13' is removed, and by using the etched BSG film 12' as a hard mask, silicon 11 is etched to form a deep trench (FIG. 1D).

After the trench is made, the BSG film 12' is removed.

However, in the case where a doped oxide like BSG, BPSG, PSG, or the like, as the hard mask material, the etched shape is more liable to vary than using other CVD $SiO_2$ film as the hard mask.

It is believed that this problem occurs because, due to the natures of BSG, BPSG and PSG readily absorbing moisture, the moisture contained in the BSG, BPSG or PSG film is released into the chamber atmosphere during processing, and this invites fluctuation of the etching characteristics.

Since the quantity of moisture absorbed in BSG, BPSG or PSG varies with the atmosphere in which the sample is exposed, it is impossible to prevent that the processing characteristics delicately change with the exposing condition and other factors.

Therefore, when a BSG, BPSG or PSG film is used, there is a problem that the etching conditions have to be changed unlike the cases using a $SiO_2$ film.

SUMMARY OF THE INVENTION

It is therefore an object of the invention to provide a method for manufacturing a semiconductor device capable of improving properties during etching without damaging the original characteristics of a doped oxide film made of BSG, BPSG, PSG, or the like.

According to one aspect of the present invention, there is provided a method for manufacturing a semiconductor device comprising the steps of:

forming a doped oxide film as a hard mask material on a silicon substrate of a subject of etching;

coating a resist on said doped oxide film;

patterning said resist and using the patterned resist as an etching mask to etch said doped oxide film and obtain a patterned hard mask;

removing said resist;

baking the subject of etching to remove moisture contained in said doped oxide film; and etching said substrate by using said patterned hard mask to make a recess.

According to another aspect of the present invention, there is provided a method for manufacturing a semiconductor device comprising the steps of:

forming a doped oxide film as a hard mask material on a silicon substrate of a subject of etching;

forming a protective cap layer on said doped oxide film;

coating a resist on said protective layer patterning said resist and using the patterned resist as an etching mask to etch said protective cap layer and said doped oxide film and obtain a patterned hard mask;

removing said resist;

baking the subject of etching to remove moisture contained in said doped oxide film; and etching said substrate by using said patterned hard mask to make a recess.

According to further aspect of the present invention, there is provided a method for manufacturing a semiconductor device comprising the steps of:

forming a doped oxide film as a first layer of an interlayer insulating film on a silicon substrate;

forming a silicon oxide film as a second layer of the interlayer insulating film on said doped oxide film;

forming a contact hole by patterning said doped oxide film and said silicon oxide film so that a surface of the silicon substrate is exposed;

performing baking to remove moisture contained in said doped oxide film; and filling contact material in the contact hole.

The semiconductor device manufacturing method according to the invention is characterized in including the step of removing moisture from a doped oxide film as a hard mask material or an interlayer insulation film by baking it after forming it, and thereafter etching its substrate by using a patterned hard mask to make a recess.

BRIEF DESCRIPTION OF THE DRAWINGS

In the attached drawings.

DETAILED DESCRIPTION OF THE PREFERRED EMBODIMENTS

Explained below are embodiments of the invention in detail with reference to the drawings.

FIGS. 2A through 2E are cross-sectional views showing steps in a process for making a deep trench which has an aspect ratio of 10 or more according to the invention.

The sample used here has a thermal oxide film (8 nm), SiN film (200 nm) and BSG (700 nm) stacked on a silicon substrate 1. However, the thermal oxide film and the SiN film are not shown in FIGS. 2A through 2E.

Figure 2A:
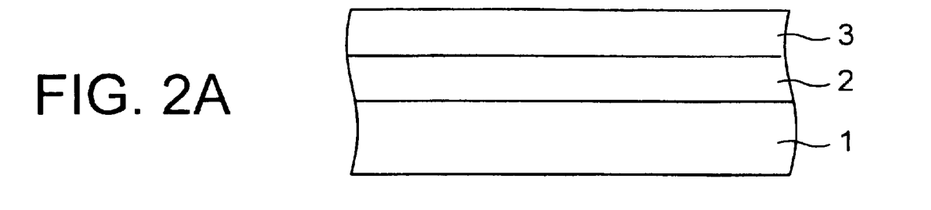
FIGS. 2A through 2E are cross-sectional views showing process steps in a method for manufacturing a semiconductor device according to the invention.

First, the silicon semiconductor substrate 1 undergoes thermal oxidation in an oxidizing atmosphere to form a thermal oxide film of 8 nm thick on its surface. Then a silicon nitride film is formed to the thickness of 200 nm. Subsequently, a BSG film is formed thereon by CVD, for example. Further, a resist 3 is coated on the BSG film by spin coating, for example (FIG. 2A).

Figure 2B:
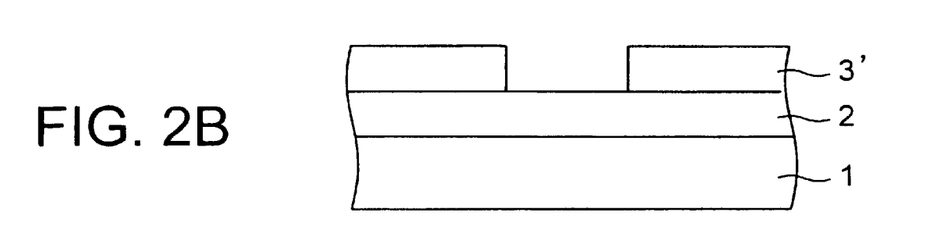

After that, using an exposure mask corresponding to a desired pattern, exposure and development are conducted to pattern the resist (FIG. 2B).

Figure 2C:
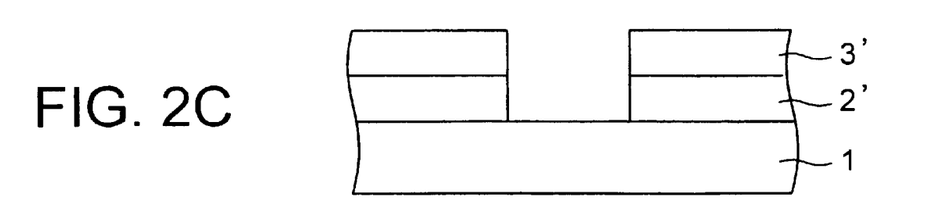

Thereafter, using the patterned resist 3' as the etching mask, the BSG film 2 is etched to obtain a pattern as the hard mask (FIG. 2C).

Figure 2D:
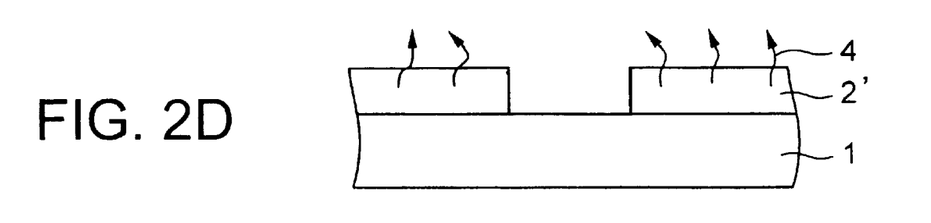

After that, the resist is removed, and baking of the patterned BSG film 2' is executed (FIG. 2D). This baking is done for 300 sec, by supplying $O_2$ gas under the flow rate of 300 sccm and the pressure of 30 Pa, and setting the temperature of the plate for supporting a wafer thereon at 250° C. As a result of the baking, moisture 4 is removed from the BSG film 2'.

Figure 2E:
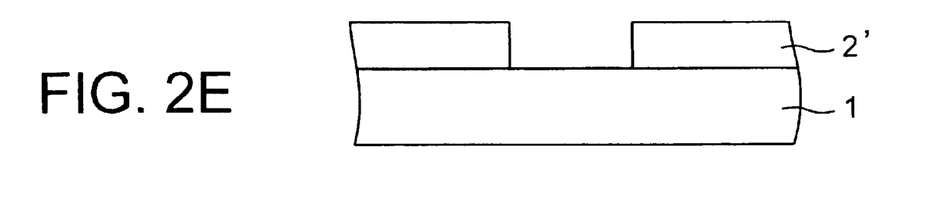

Then, using the baked BSG film 2' as the hard mask, the silicon substrate 1 is etched to make a deep trench (FIG. 2E). The BSG film is removed after the trench is made.

Thus, one of the features of the invention is that the BSG film is baked after etching thereof.

The baking temperature was determined in the following manner.

Figure 3:
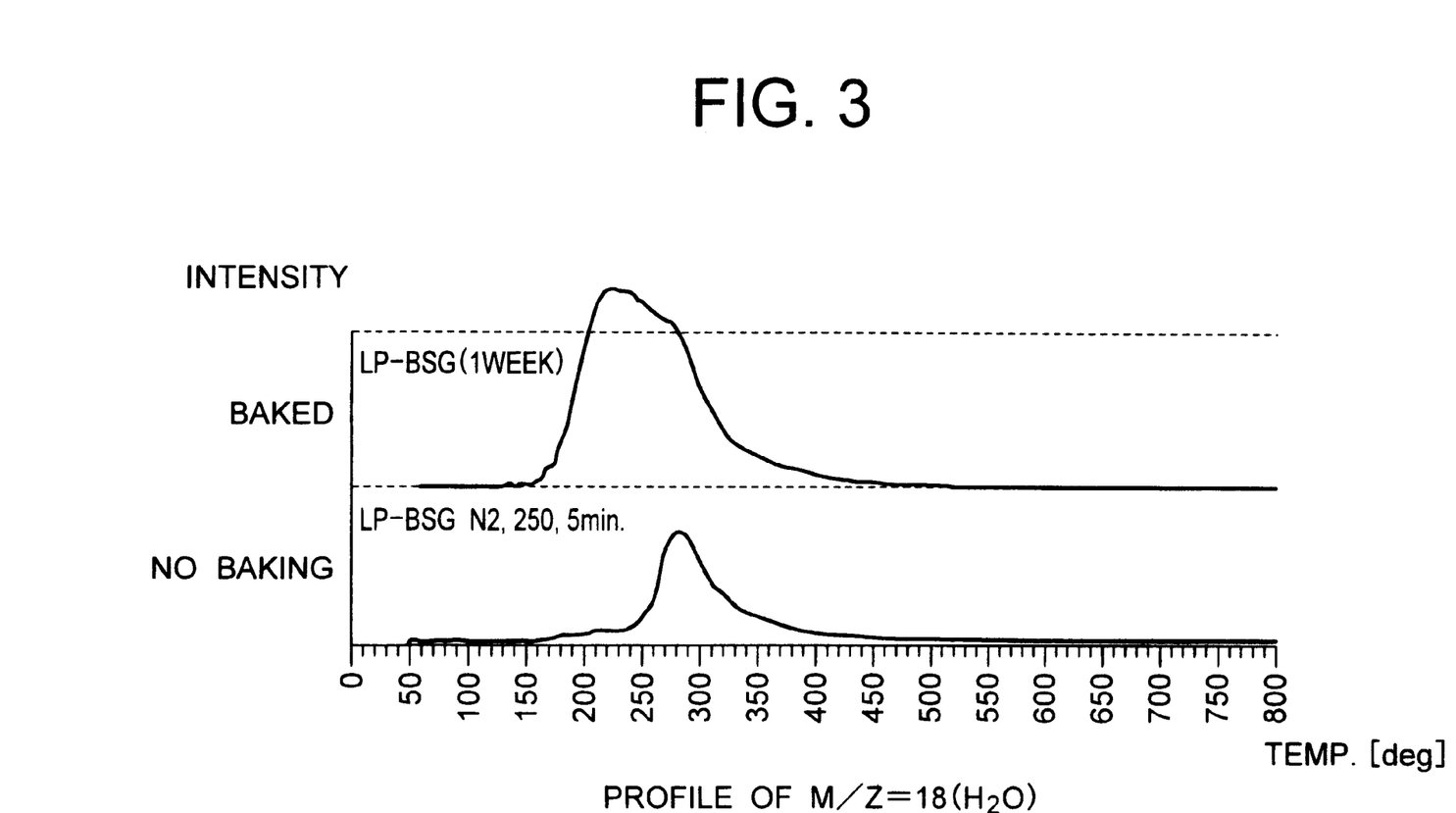
FIG. 3 shows graphs explaining selection of a baking temperature which is one of the features of the present invention.

In FIG. 3, the upper graph shows a result of analysis of the gas coming off a BSG film made without baking when the temperature increases, and the lower graph shows the same about the BSG film baked in an atmosphere with a flow of $N_2$ gas at 250° C. for five minutes. The gas remarked here is water satisfying m/z=18.

It is noted from these graphs that, when baking is executed, the quantity of the released moisture is effectively suppressed especially in the temperature range from 100 to 300° C., and it is reduced also in the temperature range from 300 to 550° C.

Since the release of moisture from BSG is in the range from 100 to 550°C., it is effective to conduct baking of BSG at the highest possible temperature within that temperature range while satisfying conditions not inviting oxidization of individual material, not inviting deterioration of BSG and higher than the temperature during etching.

FIGS. 5 through 9 are graphs showing experimental results of BSG films baked after etching and those made without baking. Respective graphs shows, for individual items, data obtained by using BSG as the etching mask material and data obtained by using TEOS in a comparative manner. As explained below, by using the invention, remarkable improvement of the etching property was confirmed. In each of these drawings, data were taken at the center of the wafer, a position 10 mm distant from an edge of the wafer, and a position 25 mm distant therefrom.

Figure 4A:
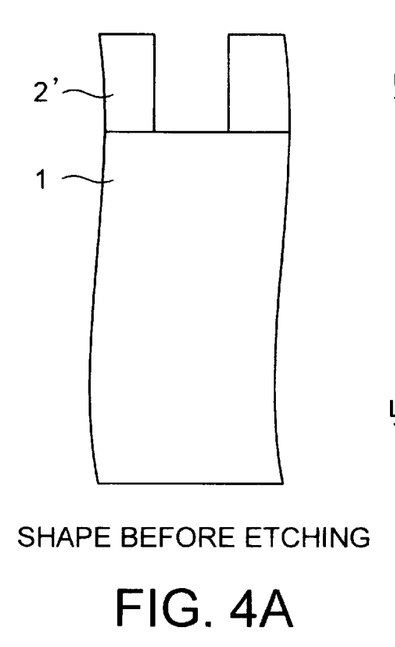
FIGS. 4A and 4B are cross-sectional views showing the configuration after etching, which is one of items to be estimated for confirming effectiveness of the use of the present invention.
Figure 4B:
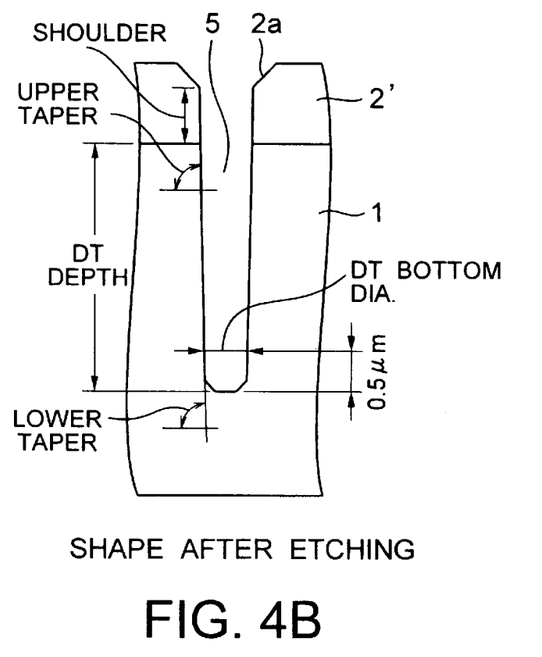

FIGS. 4A and 4B are diagrams explaining the contents of individual dimensional used in FIGS. 5–9. They define items about devices which were subjected to etching prior to trench etching in the status having formed the BSG film 2' formed on the silicon substrate 1 and patterned as the hard mask as shown in FIG. 4A, and thereby obtained the trench 5 as shown in FIG. 4B.

Figure 5:
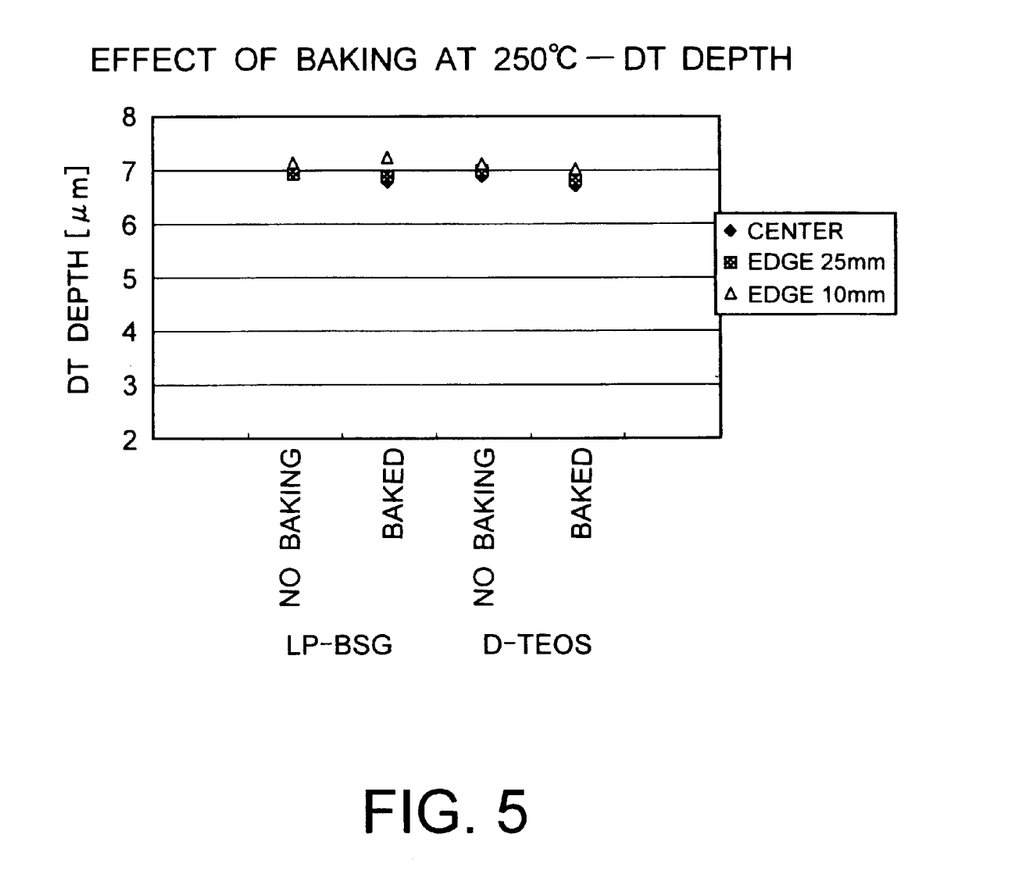
FIG. 5 is a graph showing influences of baking to the trench depth.
Figure 6:
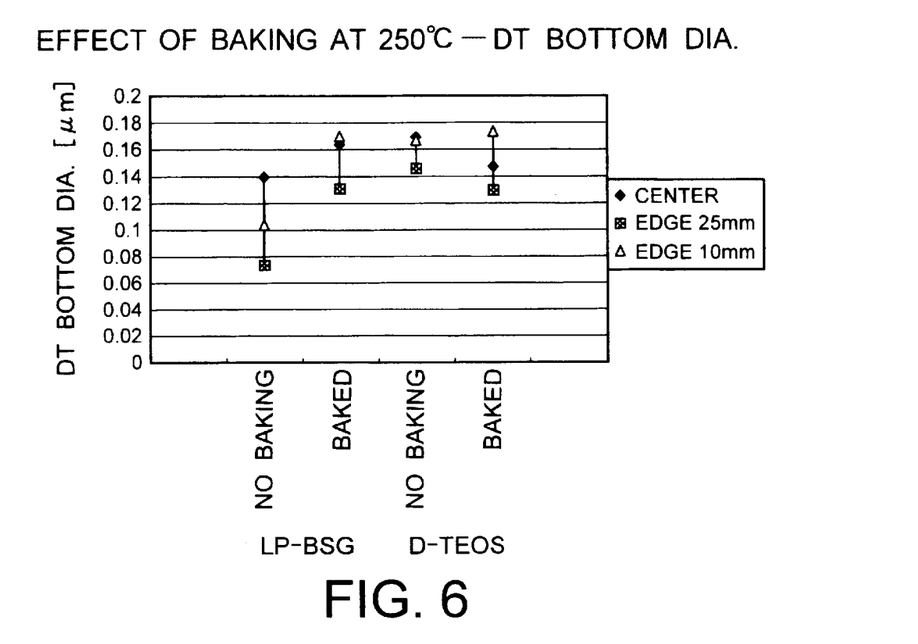
FIG. 6 is a graph showing influences of baking to the trench bottom diameter.
Figure 7:
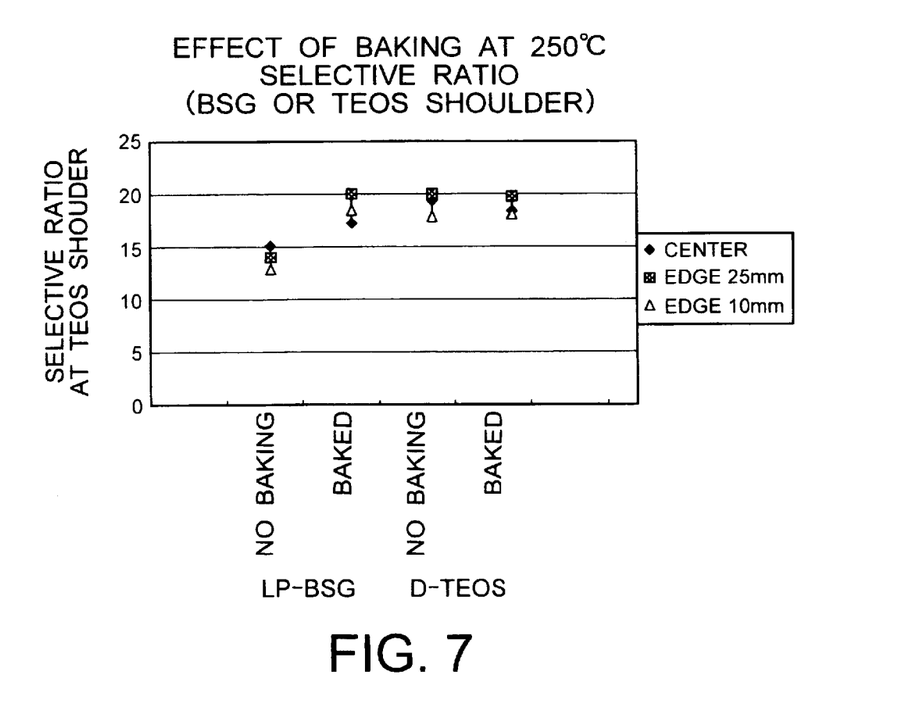
FIG. 7 is a graph showing influences of baking to the selective ratio which is the ratio of the silicon etching speed relative to the mask material.
Figure 8:
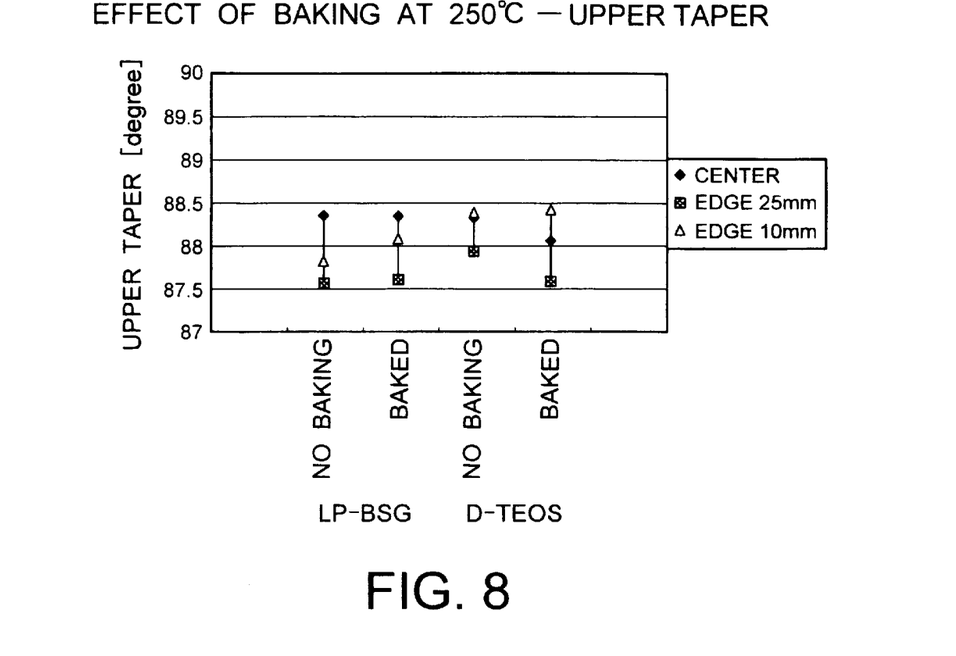
FIG. 8 is a graph showing influences of baking to an upper taper of the trench.
Figure 9:
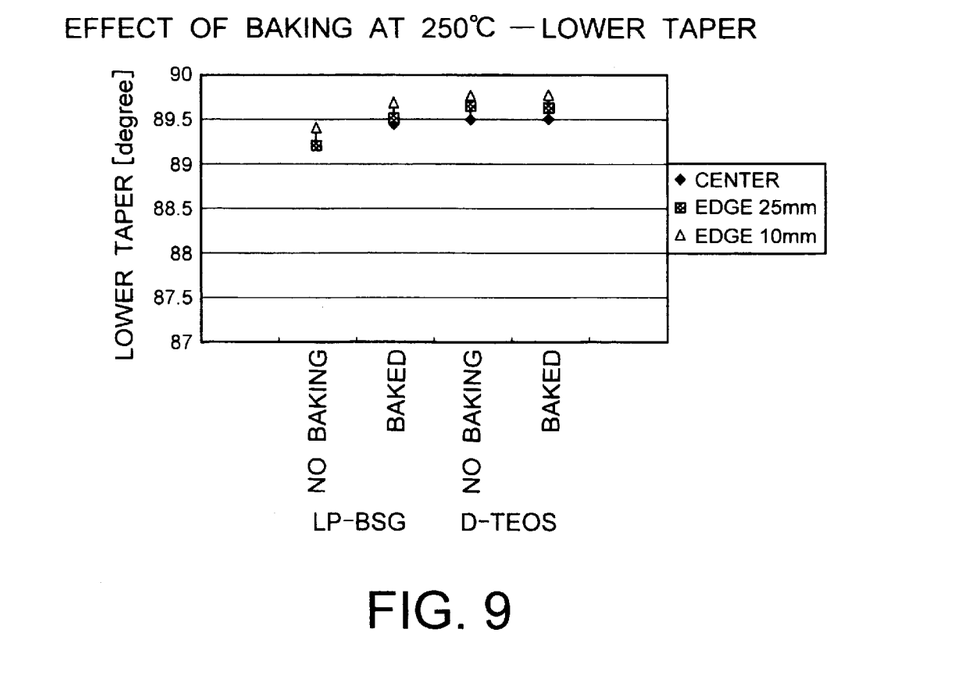
FIG. 9 is a graph showing influences of baking to a lower taper of the trench.

That is, DT depth shown in FIG. 5 is the distance from the interface between the silicon substrate and BSG to the bottom surface of the trench. DT bottom diameter shown in FIG. 6 is the diameter of the trench at the height of 0.5 $\mu$m above the bottom surface. Selective ratio shown in FIG. 7 is the ratio of the Si etching rate relative to the mask material (BSG or TEOS). Upper taper shown in FIG. 8 is the slope angle at a top portion of the trench. Lower taper shown in FIG. 8 is the slope angle at a lower portion of the trench.

As noted from these graphs, when a TEOS film is used, there is no difference in etching property between the case conducting baking and the case not conducting baking. However, when a BSG film is used, there is a difference in etching property between the case conducting baking and the case not conducting baking, and while the property is equivalent to that of the TEOS film when baking is conducted, deterioration appears about some items when baking is not conducted.

More specifically, in the graphs showing the DT bottom diameter (FIG. 6), selectivity (FIG. 7) and lower tape angle (FIG. 8), only in case of non-baked BSG, they exhibit small values. A possible reason thereof is as follows. The BSG film as the mask material is also ablated during etching although the ablated amount is very small, and at that time, moisture contained in BSG is released into the chamber atmosphere from the ablated BSG film.

Additionally, since the wafer surface temperature rises to about 150° C. when the wafer is exposed to an electric discharge, also thereby, moisture is released from the BSG film into the atmosphere.

Once the moisture is released into the chamber atmosphere, oxygen is eventually supplied from water molecules. Therefore, such release of moisture from the BSG film results in giving influences equivalent to those by adding oxygen to the etching gas.

The taper angle in the etched configuration of the trench is normally adjusted by increasing or decreasing the quantity of oxygen to be added. This adjustment mechanism is similar to the mechanism by which the taper configuration is formed. That is, during etching, $SiBr_4$ is generated as a main reaction product. At that time, if oxygen is added, $SiBr_4$ generated as the reaction product couple with oxygen, and they form $SiBr_xO_y$ (x and y are any arbitrary numbers). Since vapor pressure of $SiBr_xO_y$ is lower than that of SiBr, it stacks on the wafer surface during etching. As a result, the stacked substance eventually accumulates onto side walls of the trench to make a taper on the etched configuration.

If the quantity of oxygen to be added during etching is increased, the quantity of $SiBr_4$ coupling with oxygen also increases, and more $SiBr_xO_y$ is produced. As a result, accumulation onto the side walls of the trench during etching also increases, and a more gentle taper angle is made.

For the reasons explained above, when oxygen is added to the etching gas, the taper angle becomes gentler as the quantity of oxygen added increases.

Next made is a consideration about addition of moisture ($H_2O$). In this case, moisture contains oxygen atoms, and under the existence of $SiBr_4$, $SiBr_4$ is oxidized in the same process as that by addition of oxygen and generates $SiBr_xO_y$.

As a result, when moisture is added, it results in the same effect as that obtained by addition of oxygen, and the etched configuration exhibits a gentler angle.

In the case where BSG is not baked, a larger quantity of moisture exits in BSG. Therefore, as already explained, when the wafer temperature rises during etching, or BSG itself is etched, moisture contained therein is released during etching. As a result, moisture concentration in the etching gas atmosphere relatively increases, and it results in the same effect as that obtained by adding oxygen or moisture. As a result, the etched configuration is tapered, and the diameter of the trench decreases at its bottom.

It has been explained heretofore that, because of the release of moisture from BSG, a large amount of $SiBr_xO_y$ is generated and increases the accumulation, and the etched configuration is therefore tapered.

Next explanation is made about the case where the tapered configuration having the narrower trench bottom after etching undergoes further progressive etching. In this case, there occurs a new phenomenon different from those reviewed above.

Etching reaction occurs at the trench bottom. However, as the diameter of the trench bottom is made narrower and smaller, the area of reaction decreases. Therefore, quantity of $SiBr_4$ produced by the etching reaction decreases as compared with the case having a larger trench diameter.

At this step, since the quantity of $SiBr_4$ itself which is the source of $SiBr_xO_y$ decreases, the quantity of accumulated substance decreases. Accumulation onto the wafer surface also functions to suppress crumbling of BSG as the mask material due to etching. However, the decrease of the accumulation diminishes this effect, and hence results in increasing the crumbling amount of BSG as the mask material.

According to an experimental result obtained this time, when the trench etching is progressed to the last, accumulation increases in the initial stage of the etching due to an increase of moisture, and the effect of making the tapered configuration appears. In the latter half of the etching, accumulation decreases due to a decrease of the quantity of the reaction product, and as a result, there appears the effect of increasing the clumping amount of BSG as the mask.

Regarding the other etching properties, i.e. trench depth (FIG. 5) and upper taper (FIG. 8), it is noted that, even when using BSG, there is no difference from the etching properties obtained by using TEOS when baking is conducted. Regarding the etching rate of the BSG film by processing using $NH_4F+HF+H_2O$ after making the trench, it has been confirmed that a high etching rate equivalent to that without baking is maintained. In this respect, as explained before, TEOS involves the problem that its ablation after making the trench is difficult.

As explained heretofore, it has been confirmed that, by baking the BSG film, etching properties are improved as compared with the case without baking, and a high etching rate during processing by chemical liquids, which is a feature of the BSG film, can be maintained.

In case of the TEOS film taken as a comparative example, since no difference is found in etching properties depending upon whether the baking is done or not done, changes in etching properties are caused by the use of BSG as the film. This directly evidences that those changes occur because the BSG film has a higher hygroscopic property.

Although the foregoing embodiment has been explained as using the BSG film as the hard mask material, the same effect of baking has been confirmed also when using BPSG and PSG which are doped oxides having a high hygroscopic property like BSG. This effect is considered to derive high hygroscopic properties of BPSG and PSG similar to that of BSG.

Since the purpose of baking is to remove moisture once absorbed by BSG, the length of time from baking of the BSG film to the etching is important. In a certain experiment, actually obtained was the result that the etching properties were not affected when the etching was conducted within 13 days after baking. However, the leaving time after baking cannot be determined definitely because the hygroscopic property of BSG may vary large depending upon its film quality. It is necessary to select an acceptable leaving time through experiments taking the environmental conditions and quality of the film into consideration.

Although the foregoing embodiment is directed to making a deep trench, the invention is also applicable to other processing including processing of BSG, BPSG, PSG, etc.

Further, it is also applicable when using BSG as a hard mask material for making a shallow trench, for example.

FIGS. 10A through 10E are cross-sectional views showing process steps for forming an element isolation by a shallow trench which has an aspect ratio of less than 10.

Figure 10A:
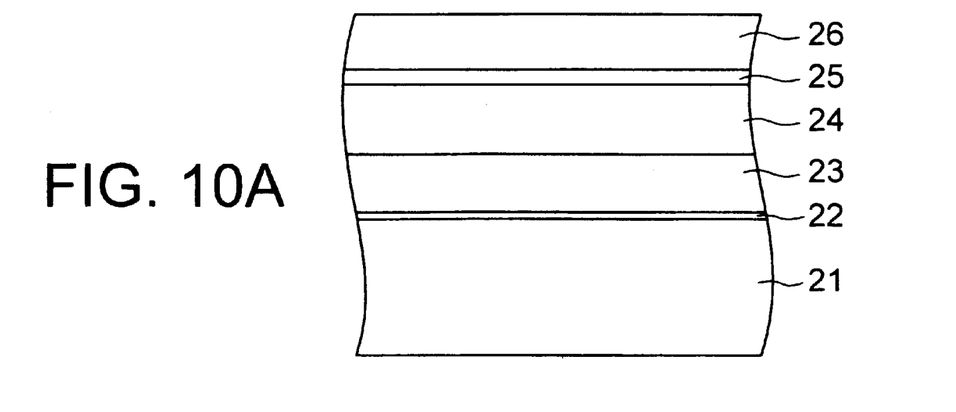
FIGS. 10A through 10E are cross-sectional views showing steps in a process for making isolation of elements by a shallow trench.
Figure 10B:
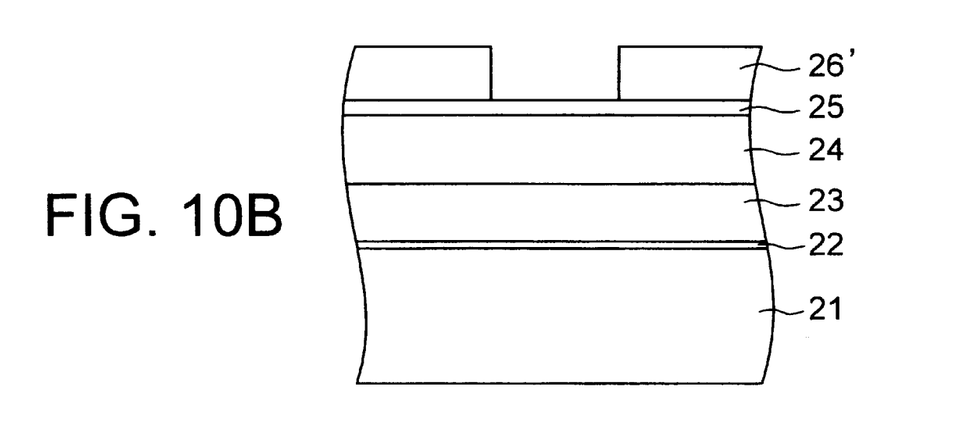
Figure 10C:
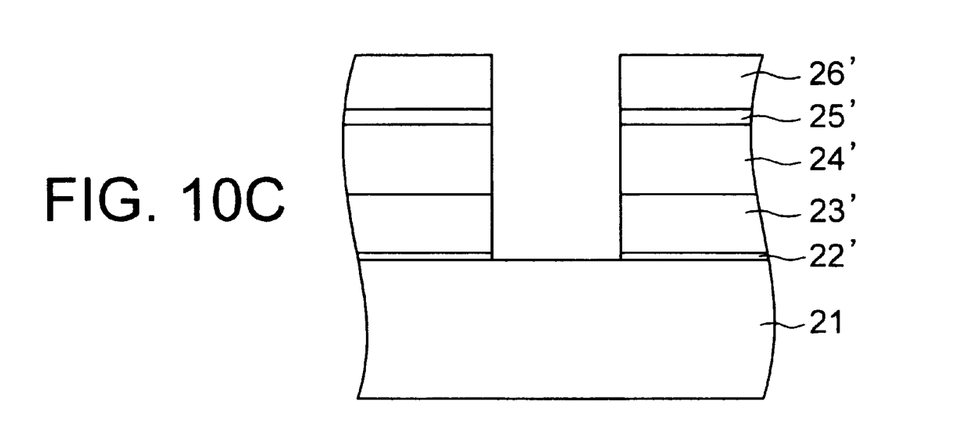
Figure 10D:
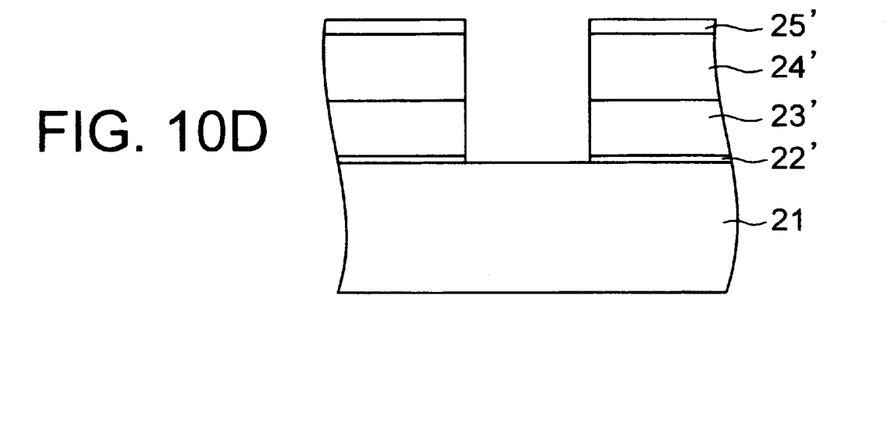
Figure 10E:
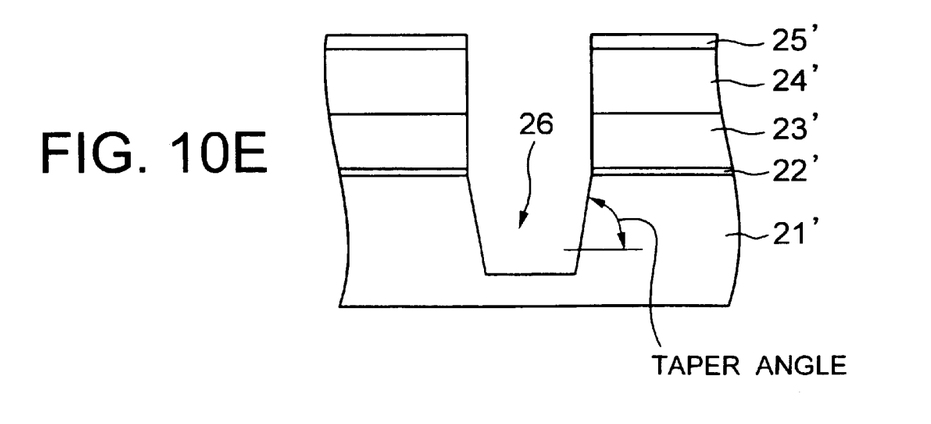

First, the surface of a silicon substrate 21 is oxidized in an oxidizing atmosphere to make a 6 nm thick thermal oxide film 22, followed by stacking thereon a silicon nitride film 23 to the thickness of 150 nm, BSG film 24 to 500 nm, and non-doped TEOS film 25 to 20 m, and coating thereon a resist 26 (FIG. 10A). Then the coated resist 26 is patterned (FIG. 10B). Using the patterned resist 26' as a mask, the non-doped TEOS film 25, BSG film 24, silicon nitride film 23 and thermal oxide film 22 are selectively removed by etching (FIG. 10C). After that, the resist is removed from the surface of the wafer by electric discharge in an oxygen atmosphere to obtain the configuration shown in FIG. 10D. Using the patterned non-doped TEOS film 25' and BSG film 24' as a mask, the silicon substrate is etched to make a shallow trench 26.

Figure 11:
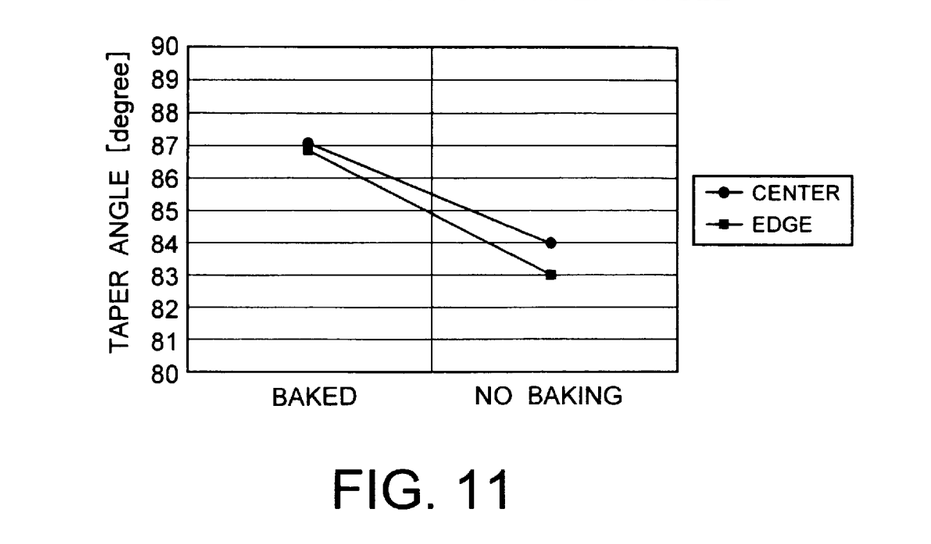
FIG. 11 is a graph showing a result of comparison in terms of tapered angle of STI between samples prepared through or not through baking of BSG prior to silicon etching for making a shallow trench.

FIG. 11 is a graph showing a result of comparison in terms of tapered angle of STI between samples prepared through or not through baking of BSG prior to silicon etching for making a shallow trench.

For etching the silicon, $Cl_2/O_2$ gas was used. Etching conditions were: 40 mTorr as pressure, 500 W as RF power, $Cl_2$ =100sccm and $O_2$ =20 sccm as gas flow rates.

As apparent from FIG. 11, the taper angle is 86° in the sample baked after silicon etching, but it is 82° in the sample prepared without baking.

That is, $SiCl_4$ generated as a reaction product of etching reaction during etching coupled with O to form $SiCl_xO_y$, and it stacked and formed a taper on the etching configuration. Without baking, however, since moisture in BSG was released during etching of the silicon and resulted in supplying excessive oxygen, the taper angle became steeper.

The embodiment shown here is different from the first embodiment in making the non-doped TEOS film on the surface of BSG. However, after processing of BSG, the BSG surface is exposed, and moisture is absorbed into BSG from this portion.

As a result, when BSG is baked, the moisture in BSG is removed, but without baking, moisture remains in BSG during etching. Probably, this affected the etching properties.

As reviewed above, even when another film exists on the BSG surface, in a process including a step which exposes the BSG surface, baking of BSG is effective.

For the purpose of preventing absorption of moisture, it is generally employed to stack a thin film such as thin non-doped CVD SiO film on the surface of a BSG, BPSG or PSG film. If the process includes a step exposing BSG, BPSG, PSG on the surface or a cross-sectional surface, moisture will be absorbed therefrom, and similarly causes changes of etching properties. In this case, by employing a baking process, etching properties can be improved.

Next explained is a case using BPSG as a part of an inter-layer insulating film.

Figure 12A:
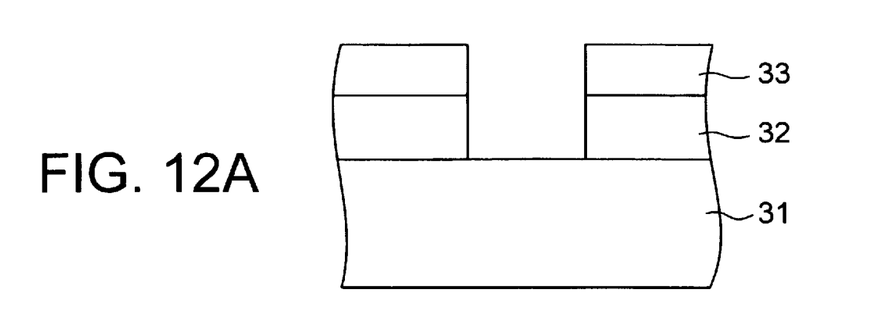
FIGS. 12A and 12B are cross-sectional views showing steps of a process in which BPSG is used as a part of an inter-layer insulating film.
Figure 12B:
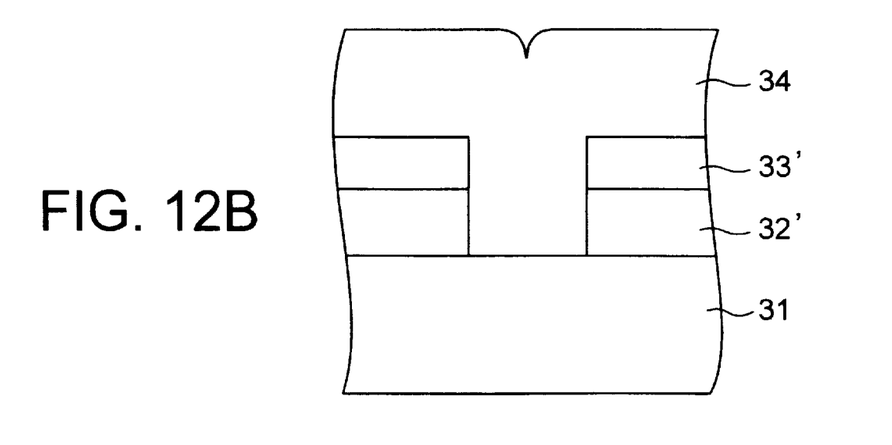

FIGS. 12A and 12B are cross-sectional views under different steps of such an embodiment. First stacked sequentially on a silicon substrate 31 are a BPSG film 32 and a silicon dioxide ($SiO_2$) film 33 which is decomposed TEOS film. Then, by using a resist (not shown) having formed a pattern of contact holes, the TEOS decomposed film and BPSG film are etched. As a result, side surfaces of the BPSG film are exposed (FIG. 12A). In this status, the BPSG film is baked at the temperature of 250° C., and tungsten 34 as a contact wiring metal is filled in the contact holes as shown in FIG. 12B.

As a result of evaluation of reliability of the contact wiring made in this manner, it was confirmed that the reliability was improved in the sample baked before filling the wiring material as compared with the sample prepared without baking.

It is presumed that, without baking, moisture contained in BPSG gradually diffused, then interacted with tungsten as the wiring material to produce tungsten oxide, and the filled tungsten did not work as the wiring material.

In contrast, when baking was conducted before burying the wiring material, moisture in BPSG was probably removed. Probably, therefore, also in the later test, there was no diffusion of moisture from BPSG. This could be the reason why the reliability of the wiring was maintained.

As explained above, when another film is formed on the surface, not only in a process including a step causing BSG, BPSG and PSG to be exposed but also in a process in which BSG, BPSG or PSG is never exposed but the thin film stacked thereon for the purpose of preventing absorption of moisture does not have a sufficient anti-hygroscopic property, baking proposed by the invention works effectively.

Baking conditions are not limited to those used in the embodiments, but they may be modified within an extent not departing from the concept of the invention, such as employing other gases, mixed gases, processing temperature, processing time, processing pressure, and so on.

As described above, according to the invention, by baking a BSG, BPSG or PSG film before etching or other processing, it is prevented from changing in configuration upon etching due to absorption of moisture.

What is claimed is:

1. A method for manufacturing a semiconductor device comprising the steps of:

forming a doped oxide film as a hard mask material on a silicon substrate as an object for etching;

coating a resist on said doped oxide film;

patterning said resist and using the patterned resist as an etching mask to etch said doped oxide film and obtain a patterned hard mask;

removing said resist by heating;

baking said object for etching to remove moisture contained in said doped oxide film by heating at higher temperature than the temperature for removing the resist; and etching said substrate by using said patterned hard mask to make a recess.

2. The method for manufacturing a semiconductor device according to claim 1, wherein said recess is a trench or a hole.

3. The method for manufacturing a semiconductor device according to claim 2, wherein said trench is a deep trench having an aspect ratio of 10 or more.

4. The method for manufacturing a semiconductor device according to claim 2, wherein said trench is a shallow trench having an aspect ratio of less than 10.

5. The method for manufacturing a semiconductor device according to claim 1, wherein said doped oxide film is made of BSG.

6. The method for manufacturing a semiconductor device according to claim 1, wherein said doped oxide film is made of BPSG.

7. The method for manufacturing a semiconductor device according to claim 1, wherein the baking is conducted in an oxygen atmosphere.

8. A method for manufacturing a semiconductor device comprising the steps of:

forming a doped oxide film as a hard mask material on a silicon substrate as an object for etching;

forming a protective cap layer on said doped oxide film;

coating a resist on said protective layer;

patterning said resist and using the patterned resist as an etching mask to etch said protective cap layer and said doped oxide film and obtain a patterned hard mask;

removing said resist by heating;

baking said object for etching to remove moisture contained in said doped oxide film by heating at higher temperature than the temperature for removing the resist; and etching said substrate by using said patterned hard mask to make a recess.

9. The method for manufacturing a semiconductor device according to claim 8, wherein said protective cap layer is a non-doped film obtained by the decomposition of TEOS.

10. The method for manufacturing a semiconductor device according to claim 8, wherein said recess is a trench or a hole.

11. The method for manufacturing a semiconductor device according to claim 10, where in said trench is a deep trench having an aspect ratio of 10 or more.

12. The method for manufacturing a semiconductor device according to claim 10, wherein said trench is a shallow trench having an aspect ratio of less than 10.

13. The method for manufacturing a semiconductor device according to claim 8, wherein said doped oxide film is made of BSG.

14. The method for manufacturing a semiconductor device according to claim 8, wherein said doped oxide film is made of BPSG.

15. The method for manufacturing a semiconductor device according to claim 8, wherein the baking is conducted in an oxygen atmosphere.

16. A method for manufacturing a semiconductor device comprising the steps of:

forming a doped oxide film as a first layer of an interlayer insulating film on a silicon substrate;

forming a silicon oxide film as a second layer of the interlayer insulating film on said doped oxide film;

coating a resist on the silicon oxide film;

patterning said resist;

forming a contact hole using the patterned resist as an etching mask to etch said doped oxide film and said silicon oxide film so that a surface of the silicon substrate is exposed;

removing said resist by heating;

performing baking to remove moisture contained in said doped oxide film by heating at a higher temperature than the temperature which removes the resist; and filling the contact hole with contact material.

17. The method according to claim 16, wherein said doped oxide film is made of BPSG.

18. The method according to claim 16, wherein said silicon oxide film is obtained by decomposing TEOS.

19. The method according to claim 16, wherein the baking is conducted in an oxygen atmosphere.

20. The method according to claim 16, wherein said contact material filled in the contact hole is tungsten.

* * * * *